US 6,649,489 B1

United States Patent
Chang et al.

(10) Patent No.: US 6,649,489 B1
(45) Date of Patent: Nov. 18, 2003

(54) POLY ETCHING SOLUTION TO IMPROVE SILICON TRENCH FOR LOW STI PROFILE

(75) Inventors: Li-Wen Chang, Taipei (TW); Hung-Cheng Sung, Hsin-chu (TW); Der-Shin Shyu, Hsinchu (TW); Han-Ping Chen, Hsin Chu (TW); Chen-Ming Huang, Jungli (TW); Ya-Chen Kao, Taoyuan (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/366,207

(22) Filed: Feb. 13, 2003

(51) Int. Cl.[7] .............................................. H01L 21/76
(52) U.S. Cl. ...................... 438/424; 438/443; 438/445; 438/296
(58) Field of Search ................................. 438/296, 404, 438/424, 426, 435, 437, 294, 295, 427, 443, 445

(56) References Cited

U.S. PATENT DOCUMENTS

| | | | | |
|---|---|---|---|---|
| 5,677,231 A | * | 10/1997 | Maniar et al. ............... | 438/221 |
| 6,133,105 A | | 10/2000 | Chen et al. .................. | 438/296 |
| 6,180,493 B1 | * | 1/2001 | Chu ............................ | 438/437 |
| 6,265,302 B1 | * | 7/2001 | Lim et al. .................... | 438/622 |
| 6,268,264 B1 | * | 7/2001 | Tseng .......................... | 438/424 |
| 6,297,126 B1 | * | 10/2001 | Lim et al. .................... | 438/424 |
| 6,303,465 B1 | | 10/2001 | Liao ............................ | 438/424 |
| 6,323,092 B1 | | 11/2001 | Lee ............................. | 438/296 |
| 6,355,539 B1 | | 3/2002 | Lai et al. ..................... | 438/424 |
| 6,368,970 B1 | * | 4/2002 | Abdul-Hak et al. ......... | 438/690 |
| 6,372,604 B1 | * | 4/2002 | Sakai et al. ................. | 438/425 |
| 6,472,324 B2 | * | 10/2002 | Kusakabe et al. ........... | 438/692 |
| 2002/0197823 A1 | * | 12/2002 | Yoo et al. .................... | 438/424 |

* cited by examiner

Primary Examiner—Michael Trinh
Assistant Examiner—Khanh B. Duong
(74) Attorney, Agent, or Firm—George O. Saile; Stephen B. Ackerman

(57) ABSTRACT

A method of etch polysilicon adjacent to a recessed STI structure feature is described. A substrate is provided with a dielectric layer thereon and a polysilicon layer on the dielectric layer. A shallow trench is formed that extends through the polysilicon and dielectric layers into the substrate. An insulating material is used to fill the trench and is then recessed in the trench below the surface of the substrate by polishing and etching steps. A conformal buffer layer is deposited which covers the polysilicon and sidewalls of the trench above the recessed insulating layer. The buffer layer is etched back to expose the insulating layer and the polysilicon is removed by a plasma etch. A spacer comprised of a portion of the buffer layer protects the substrate during the polysilicon etch to prevent unwanted trenches from being formed adjacent to the STI structure, thereby increasing the etch process window.

32 Claims, 3 Drawing Sheets

FIG. 1d – Prior Art

POLY ETCHING SOLUTION TO IMPROVE SILICON TRENCH FOR LOW STI PROFILE

FIELD OF THE INVENTION

The present invention relates to a method of fabricating an integrated circuit device. More particularly, the present invention relates to a method of forming recessed shallow trench isolation (STI) structures that is free of trench defects in the silicon substrate adjacent to the STI sidewalls.

BACKGROUND OF THE INVENTION

Integrated circuits in microelectronic devices are becoming smaller in order to provide higher performance for products requiring advanced technology. The integrated circuits are comprised of several layers which are individually formed with a unique pattern. The pattern is transferred from a reticle or mask into a photoresist layer on a substrate during a lithography process. The pattern is then transferred from the photoresist layer into an underlying substrate by a plasma etch process. After the photoresist is removed, a pattern remains in the substrate and consists of trenches, via holes, or other features that form pathways for electrical connections within and between layers.

In certain layers, shallow trench isolation (STI) structures are needed to separate areas where active devices are to be located. The process typically involves forming a trench between areas where active devices will be located, filling the trench in a high density plasma (HDP) chemical vapor deposition (CVD) process with a dielectric material and employing a planarizing step such as chemical mechanical polishing (CMP) to smooth the surface. Dielectric materials such as silicon dioxide insulate active devices from one another and thereby prevent crosstalk between wiring which would have a detrimental impact on device performance. In advanced technologies, low k dielectric materials are being implemented because of their improved insulating capability.

Problems can occur when processing layers adjacent to an STI structure. U.S. Pat. No. 6,323,092 describes a method to prevent a recess from being formed in a dielectric material at the top corners of the STI structure during an etch to remove an overlying pad oxide. The recess causes an undesirable leakage current to be generated. An oxide is grown at the top corners of the STI structure to protect the dielectric material from an etchant.

An unwanted groove at the top corners of an STI structure is also addressed in U.S. Pat. No. 6,355,539. An oxide liner is formed in the trench before the dielectric material is deposited to fill the structure. Then a spacer consisting of layers of polysilicon and silicon dioxide is constructed adjacent to the trench. The spacer protects the STI corners during subsequent wet etch steps. The exposed silicon substrate and polysilicon in the spacer are oxidized to form a gate oxide layer and a continuous oxide spacer, respectively.

STI structures are modified to enable a larger process window when forming borderless contacts. In U.S. Pat. No. 6,133,105, a shallow trench contains two oxide layers separated by a nitride layer. The level of fill within the trench is recessed to allow a silicide spacer to be formed over an adjacent source/drain region and extend into the shallow trench. The silicide extension into the trench provides a better overlap when a hole to contact the silicide is printed slightly out of alignment. In a related patent, U.S. Pat. No. 6,303,465, the level of oxide within a shallow trench is recessed. A layer of conformal oxide is deposited followed by an etch stop layer such as silicon nitride. The nitride is etched back to protect the STI corners during subsequent processing.

In a flash memory process, the level of dielectric layer in an STI structure may be recessed below substrate level according to design. Furthermore, the level of dielectric layer in the trench in the cell array is usually lower than in the trench in the peripheral devices. As a result, exposed silicon in the substrate adjacent to the STI structures is especially susceptible to etching during subsequent process steps. For example, an STI structure is formed by a process that involves depositing a pad oxide on a substrate and a polysilicon layer on the pad oxide. A trench that is patterned in the polysilicon layer is etched through the pad oxide and into the substrate and is then filled with a dielectric material. After the dielectric layer is planarized and etched back to leave a recess within the trench, the polysilicon cap is typically removed by a plasma etch method. However, the exposed silicon substrate adjacent to the trench sidewalls is likely to be attacked by the etchant to form unwanted grooves adjacent to the STI structure. These grooves defects lead to a large cell leakage current that degrades device performance. Even in a rare situation when grooves are avoided during the polysilicon etch, the process window is so small as to not be acceptable for manufacturing requirements. Therefore, an improved method of forming a recessed dielectric layer within an STI structure without generating groove defects is needed. Ideally, the method should also encompass a large process window during the process of etching back the dielectric layer within the trench.

SUMMARY OF THE INVENTION

An objective of the present invention is to provide a method for forming a recessed dielectric layer in a STI structure such that no grooves or trenches are formed in the substrate adjacent to the STI structure.

Another objective of the present invention is to provide a low cost method for preventing trench defects in a substrate during fabrication of a recessed dielectric layer in a STI structure.

A still further objective is to improve the process window for etching a cap layer between trenches during the fabrication of recessed dielectric layer in a STI structure.

These objectives are accomplished by providing a substrate having a first dielectric layer such as a pad oxide formed thereon. A cap layer is deposited on the pad oxide layer and then trench openings are formed in the cap layer which is preferably polysilicon but may also be a hard mask such as silicon nitride. The trench pattern is transferred through the pad oxide and into the substrate with a plasma etch process. The width of the polysilicon and pad oxide is reduced by an etch step. A second dielectric layer is deposited to fill the trench openings and extends above the polysilicon layer. After a planarizing process to make the second dielectric layer coplanar with the polysilicon layer, an etch step is employed to recess the second dielectric layer in the trenches below the substrate surface. A buffer material such as high temperature oxide (HTO) is then deposited to form a conformal layer on the substrate. The buffer layer is etched back to expose the top surface of the polysilicon layer but remains on the sidewalls of the polysilicon layer an on the sidewalls of the trenches. A polysilicon etch can now be performed without causing any unwanted trenches in the substrate since the substrate adjacent to the STI structure is protected by a spacer comprised of the buffer material.

Furthermore, the process window for the polysilicon etch is wide enough to be acceptable in a manufacturing scheme.

BRIEF DESCRIPTION OF THE DRAWINGS

The drawings are intended to provide a more thorough understanding of the invention. The drawings illustrate embodiments of the invention and together with the description serve to explain the principles of the present invention.

FIG. 1d is a cross-sectional drawing showing the trench defects formed in the substrate after etching a polysilicon cap layer in the structure in FIG. 1c by a previous method practiced by the inventors.

DETAILED DESCRIPTION OF THE INVENTION

The present invention relates to a method of forming a recessed dielectric layer in a STI structure during the fabrication of a microelectronics device. The method is especially useful for etching a polysilicon cap layer between STI structures without forming unwanted groove defects in the substrate but may apply to other cap layers such as silicon nitride. Although a process is described that applies to a flash memory device, those skilled in the art will recognize that the method is also useful for producing recessed dielectric layers in other types of devices.

Figure 1A:
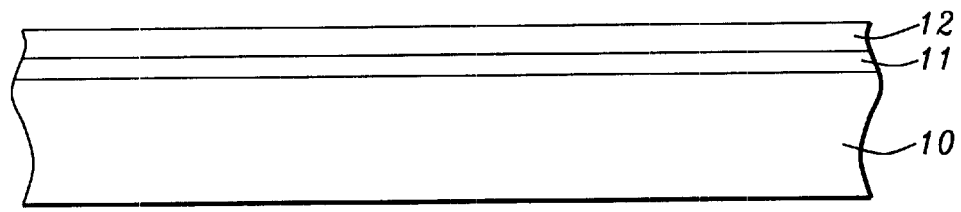
FIG. 1a is a cross-sectional drawing of a substrate prior to forming an STI structure.

The invention will be described with reference to the drawings which are not necessarily drawn to scale. Referring to FIG. 1a, a substrate 10 that is typically silicon but may optionally be based on a silicon-germanium or gallium-arsenide technology is provided which may be doped or undoped and which may contain a substructure (not shown) that includes active and passive devices. A first dielectric layer 11 is deposited on substrate 10 by a method such as a chemical vapor deposition (CVD) technique and is typically an oxide such as a pad oxide with a thickness of about 90 to 130 Angstroms.

In the first embodiment, a cap layer 12 which is preferably polysilicon with a thickness in the range of about 700 to 2000 Angstroms is deposited on first dielectric layer 11 by a process such as a CVD or plasma enhanced CVD (PECVD) technique.

Figure 1B:
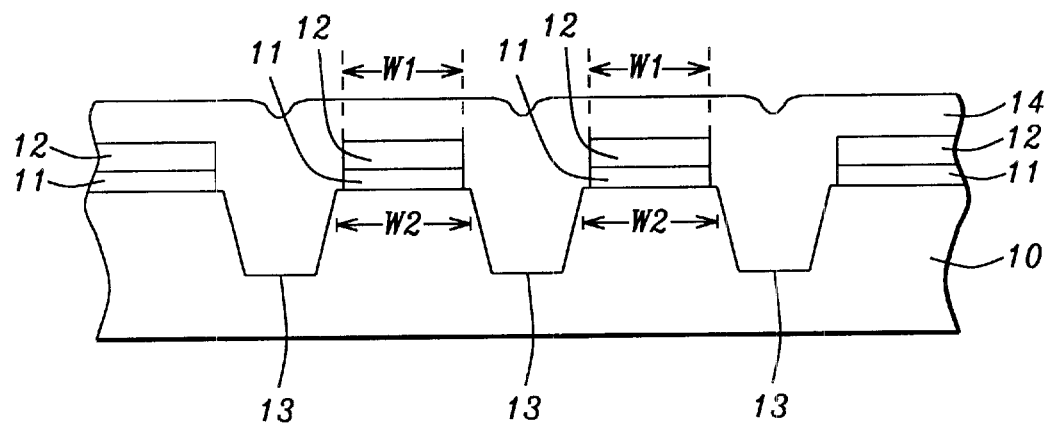
FIG. 1b is cross-sectional drawing showing a dielectric layer filling shallow trenches in the substrate from FIG. 1a according to a method of the present invention.

Referring to FIG. 1b, a trench 13 is formed by a conventional method that usually involves coating a photoresist layer (not shown) on cap layer 12 and printing a trench pattern in the photoresist. The pattern is etch transferred through cap layer 12 and first dielectric layer 11 and into substrate 10 to produce trench openings 13. The depth of trench 13 in substrate 10 is from about 3000 to 4000 Angstroms. Note that the width at the bottom of the trenches 13 may be smaller than the width at the top of the trench opening. The photoresist layer is typically removed at this point by a plasma ashing that may be followed by a conventional cleaning step to remove any organic residues.

A second etch process is employed to laterally shrink the cap layer 12 so that the width $w_1$ of the cap layer 12 is less than the width $w_2$ between two adjacent trenches. In one example of a flash memory process practiced by the inventors, the width of a polysilicon cap layer 12 is reduced from a dimension $w_2$ to a dimension $w_1$ by a plasma etch method that typically involves a $CF_4$ flow rate of from 80 to 100 standard cubic centimeters per minute (sccm), a chamber pressure of 20 to 40 Torr, a RF power between about 400 and 600 Watts, and a temperature of from 20° C. to 40° C. for a period between about 18 and 30 seconds.

A second dielectric layer 14 such as silicon dioxide is deposited to fill trench openings 13 to a level above cap layer 12. When a low k dielectric material with better insulating properties than $SiO_2$ is needed, the second dielectric layer 14 may be comprised of a material such as carbon doped oxide, fluorine doped oxide, a polysilsesquioxane, a polyimide, fluorosilicate glass, a polyarylether or other low k materials known to those skilled in the art. The second dielectric layer 14 may be deposited by a CVD or PECVD technique or by a spin on method in the case of applying an organic polymer solution that is subsequently dried by a curing method. Note that the second dielectric layer 14 may not be completely planarized, especially in regions above the trenches 13.

Figure 1C:
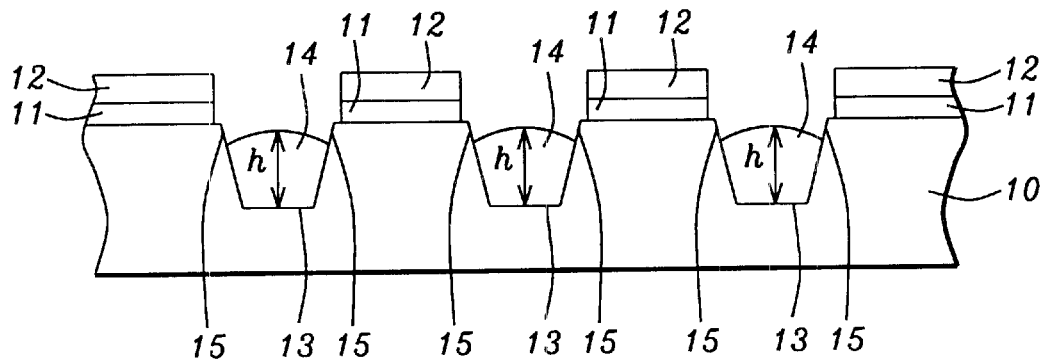
FIG. 1c is a cross-sectional drawing of the structure in FIG. 1b after a planarizing step and an etch are performed to recess the dielectric material in the trenches according to an embodiment of the present invention.

Referring to FIG. 1c, a planarizing step such as a chemical mechanical polish (CMP) method is used to lower the level of dielectric layer 14 until it is coplanar with cap layer 12. Then an etch that is preferably a plasma etch is employed to recess the level of the second dielectric layer 14 in trenches 13 below the surface of substrate 10. Typically a fluorocarbon based plasma is employed when the second dielectric layer 14 is comprised of an oxide. Optionally, a second dielectric layer 14 that is oxide based may be recessed by dipping into a buffered HF solution for about 80 to 150 seconds at approximately 30° C. Note that regions 15 of substrate 10 that are adjacent to first dielectric layer 11 and on the sidewall of trench 13 above second dielectric layer 14 are exposed. In the flash memory process practiced by the inventors, the STI height h in the cell array is always lower than the STI height in the peripheral devices. Thus, the cell array is more susceptible to groove or trench defects as depicted in FIG. 1d than the peripheral devices.

Referring to FIG. 1d, trench defects also referred to as groove defects 16 are formed when a polysilicon cap layer 12 as shown in FIG. 1c is removed by a plasma etch process according to a previous method practiced by the inventors. When cap layer 12 is polysilicon, the removal step typically comprises a plasma generated from a gas mixture including HBr and $Cl_2$. However, the exposed regions 15 on substrate 10 are also attacked. As a result, small trenches defects 16 adjacent to shallow trenches 13 are formed. These unwanted trenches defects 16 cause a high leakage current that lowers performance in the final device. In some cases, the trench defects may be avoided. However, the process window for avoiding trench defects during the polysilicon etch is so small that the etch process is not cost effective in a manufacturing environment.

Figure 2A:
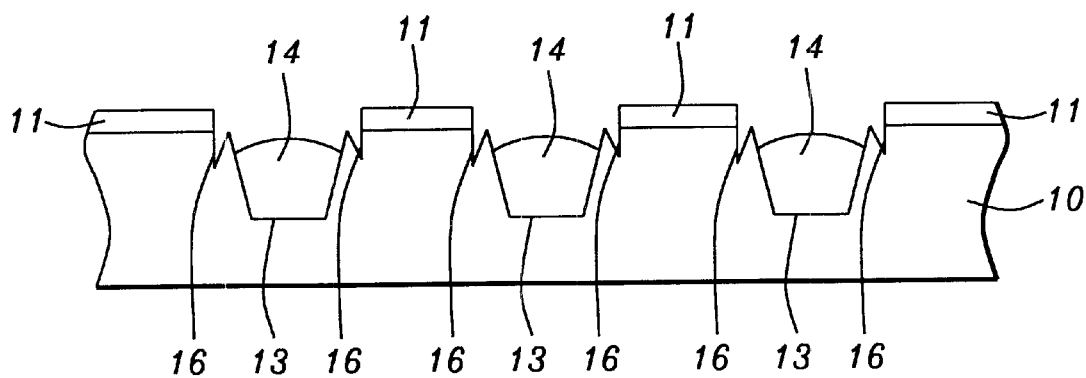
FIG. 2a is a cross-sectional drawing illustrating a buffer layer formed over the structure in FIG. 1c according to a method of the present invention.
Figure 2A:
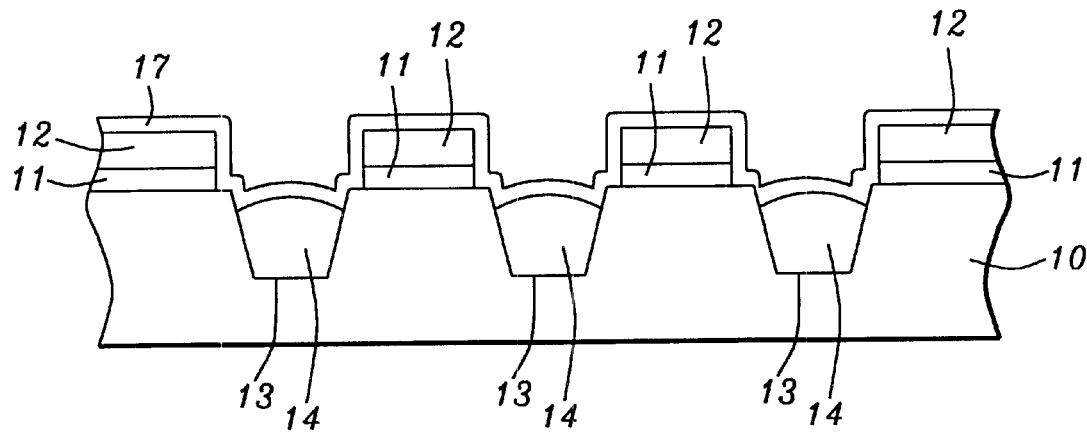

Referring to FIG. 2a, a key step in the invention is the deposition of a highly conformal oxide buffer layer 17 that is from about 100 to about 200 Angstroms thick on polysilicon cap layer 12 and on the STI structure shown in FIG. 1c. The buffer layer also covers the sidewalls of first dielectric layer 11 and substrate 10 above second dielectric layer 14. In one embodiment, buffer layer 17 is a high temperature oxide (HTO) that is grown in an oxygen ambient in a temperature range between about 700° C. and 900° C. An oxide layer that can serve as buffer layer 17 may also be deposited by other methods such as a CVD or PECVD technique. Optionally, the buffer layer 17 may be comprised of tetraethylorthosilicate (TEOS) that is deposited by conventional means known to those skilled in the art.

Figure 2B:
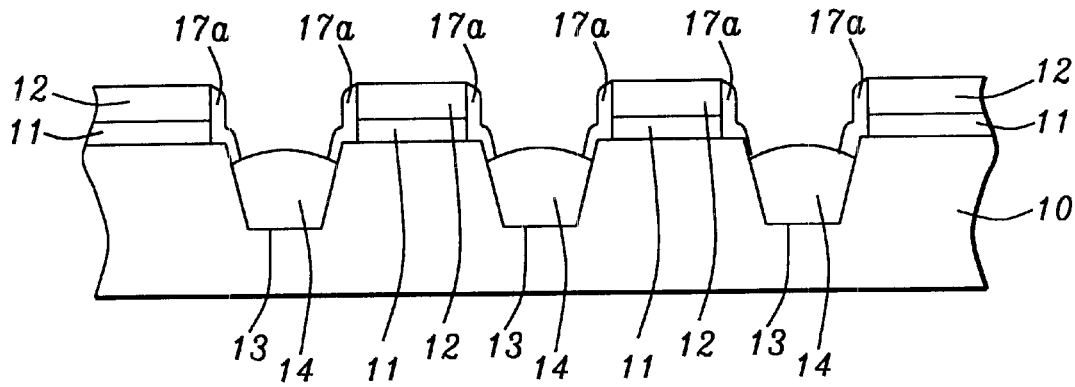
FIG. 2b is a cross-sectional drawing depicting the result of etching the buffer layer in FIG. 2a to expose the top surface of the cap layer.

Referring to FIG. 2b, the buffer layer 17 is etched back to expose the top surface of polysilicon cap layer 12 by an etch method. Preferably, the etch is performed with a plasma that is generated from $C_2F_6$ at a temperature of about 40° C. with a RF power of about 200 Watts and a chamber pressure of approximately 4 mtorr for a period of 10 to 30 seconds. Depending upon the type of tool and substrate, other pressure and RF power settings are also acceptable. Alternatively, another fluorocarbon gas such as $CF_4$ may be used to generate the plasma to remove the buffer layer 17 above polysilicon cap layer 12. A spacer 17a comprised of the oxide in buffer layer 17 in FIG. 2a remains on the sidewalls of cap layer 12, first dielectric layer 11, and on substrate 10 above the level of second dielectric layer 14. Note that the buffer layer 17 is also removed above second dielectric layer 14 except along the sidewalls of the trench 13.

Figure 2C:
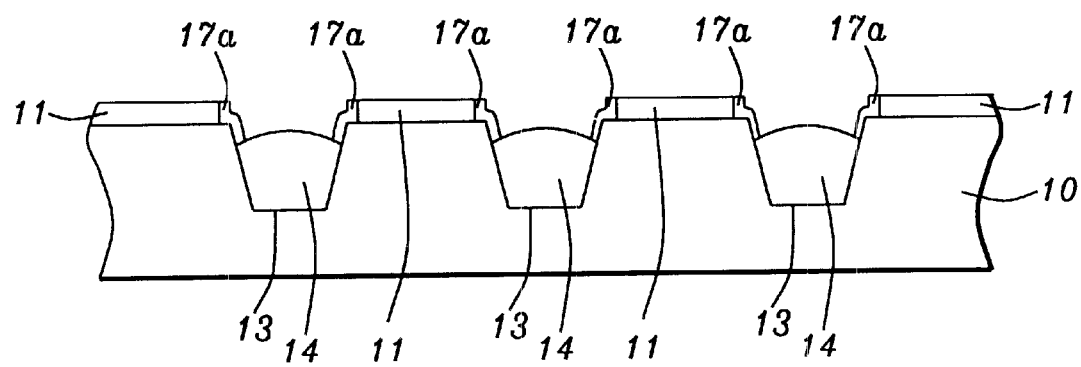
FIG. 2c is a cross-sectional view of the structure in FIG. 2b after the cap layer is removed by an etch.

In FIG. 2c, a polysilicon etch according to the present invention is performed by a process with the following conditions: a 10 to 20 sccm flow rate of $Cl_2$, a 150 to 200 sccm flow rate of HBr, a chamber pressure of from 4 to 12 Torr, a RF power between about 100 and 400 Watts, a temperature of from 40° C. to 70° C., for a period of from 50 to 100 seconds. Optionally, oxygen may be added to the gas mixture. As a result, polysilicon cap layer 12 and the adjoining portion of spacer 17a above first dielectric layer 11 are removed. A thin spacer 17a remains on the sidewall of first dielectric layer 11 and on substrate 10 in trench 13 above the level of second dielectric layer 14. The spacer 17a protects the substrate 10 during the etch of polysilicon cap layer 12 so that no undesirable trench defects are produced adjacent to the STI structures 13. Furthermore, spacer 17a may remain as a permanent part of the device. At this point, additional processing can proceed to complete the flash memory device. However, the details are not pertinent to this invention and are not disclosed herein.

The method as described for the first embodiment is beneficial in that it prevents trench defects from forming in the substrate during the polysilicon cap etch. Therefore, the polysilicon cap layer etch process window is improved so that it satisfies manufacturing requirements. For example, in prior art practiced by the inventors, a 35 second poly etch time is needed to avoid polysilicon residues. However, if the polysilicon etch exceeds 40 seconds, then trench defects as shown in FIG. 1d are formed. The five second window for the polysilicon etch is considered too narrow for an acceptable manufacturing process. When the buffer layer described in the first embodiment is implemented, the polysilicon etch window improves substantially to 25 seconds. The wider process window improves yields and reduces rework and thereby lowers manufacturing cost. Additionally, the application of the buffer layer is a low cost process because it can be achieved with existing tools and materials. A similar benefit is realized with the alternative buffer layers mentioned previously in improving the process window for etching a cap layer during STI fabrication.

In a second embodiment, cap layer 12 is a hard mask such as silicon nitride that is deposited by a CVD or PECVD method on a first dielectric layer 11 above a substrate 10 in FIG. 1a. A trench opening 13 is formed by patterning a photoresist layer (not shown) on cap layer 12 and transferring the pattern into substrate 10 with one or more plasma etch steps. The width of cap layer 12 and first dielectric layer 11 are reduced with a plasma etch from a dimension $w_2$ to $w_1$ as depicted in FIG. 1b. In FIG. 1c, a second dielectric layer 14 that may be $SiO_2$ or a low k dielectric material is deposited to fill trenches 13 to a level above cap layer 12. Second dielectric layer 14 is planarized by a method such as a CMP step so that it is coplanar with cap layer 12. Second dielectric layer 14 is preferably etched back to a thickness h that is below the top of substrate 10 in trenches 13 by a plasma etch method although a buffered HF dip as described in the first embodiment is also possible.

Referring to FIG. 2a, an oxide buffer layer 17 that may be HTO, PECVD oxide, or TEOS is deposited on substrate 10 to a thickness of between 100 and 200 Angstroms. Buffer layer 17 is essentially conformal and covers the top and sidewalls of cap layer 12 as well as the sidewalls of dielectric layer 11 and sidewalls of substrate 10 in trenches 13 above the level of second dielectric layer 14. Referring to FIG. 2b, the buffer layer 17 is etched back to expose the top surface of cap layer 12. Preferably, the plasma etch is performed with a plasma that is generated from $C_2F_6$ at a temperature of about 40° C. for a period of 10 to 30 seconds and with a RF power of about 200 Watts and a chamber pressure of around 4 mtorr although other RF power and pressure settings are also acceptable. Alternatively, another fluorocarbon gas such as $CF_4$ may be used to generate the plasma to remove the buffer layer 17 above cap layer 12. A spacer 17a comprised of the oxide in buffer layer 17 in FIG. 2a remains on the sidewalls of cap layer 12, first dielectric layer 11, and on substrate 10 above the level of second dielectric layer 14. The buffer layer 17 is also removed above second dielectric layer 14 except along the sidewalls of the trench 13.

In FIG. 2c, cap layer 12 is removed by a wet etch or plasma etch process. As a result, cap layer 12 and the adjoining portion of spacer 17a above first dielectric layer 11 are removed. A thin spacer 17a remains on the sidewall of first-dielectric layer 11 and on substrate 10 in trench 13 above the level of second dielectric layer 14. The spacer 17a protects the substrate 10 during the etch of cap layer 12 so that no undesirable trench defects are produced adjacent to the STI structures 13. Furthermore, spacer 17a can remain as a permanent part of the device. At this point, additional processing can proceed to complete the flash memory device.

All the advantages that relate to the first embodiment are also realized in the second embodiment. The process window for removal of cap layer 12 is widened since substrate 10 adjacent to trenches 13 and above second dielectric layer 14 is protected by the buffer layer. The buffer layer also prevents the etchant that removes cap layer 12 from attacking substrate 10 and forming unwanted trench defects adjacent to trenches 13. The method can be exercised without any additional tools in order to minimize cost. Any loss in throughput is more than offset by a gain in device yield and performance.

While this invention has been particularly shown and described with reference to, the preferred embodiments thereof, it will be understood by those skilled in the art that various changes in form and details may be made without departing from the spirit and scope of this invention.

We claim:

1. A method of forming a shallow trench isolation structure, said method comprising:

providing a substrate having a first dielectric layer thereon and a cap layer over said first dielectric layer;

forming a trench in said cap layer and in said first dielectric layer that extends into said substrate;

filling said trench with a second dielectric layer;

forming a recessed level of the second dielectric layer within said trench;

depositing a conformal oxide buffer layer on said cap layer and within said trench;

etching back said buffer layer to expose said cap layer and said second dielectric layer between the sidewalls of said trench; and removing said cap layer with an etch process.

2. The method of claim 1 wherein said first dielectric layer is comprised of silicon dioxide with a thickness in the range of about 90 to 130 Angstroms.

3. The method of claim 1 wherein the depth of said trench is between about 3000 and 4000 Angstroms.

4. The method of claim 1 further comprised of reducing the width of the cap layer and first dielectric layer between said trenches by a plasma etch process prior to filling said trenches.

5. The method of claim 1 wherein said second dielectric layer is comprised of $SiO_2$ or a low k dielectric material comprised of fluorine doped $SiO_2$ or carbon doped $SiO_2$.

6. The method of claim 1 wherein said recessed second dielectric layer is formed by a process comprising the steps of:

planarizing the second dielectric layer to become coplanar with said cap layer; and etching the coplanar second dielectric layer to a height that is below the surface of said substrate.

7. The method of claim 6 wherein etching to recess the second dielectric layer is performed with a buffered HF treatment for about 80 to 150 seconds at about 30° C.

8. The method of claim 6 wherein the etching to recess the second dielectric layer is performed with a plasma etch method.

9. The method of claim 1 wherein said buffer layer has a thickness between about 100 and 200 Angstroms.

10. The method of claim 1 wherein the buffer layer is comprised of a high temperature oxide (HTO) that is grown at a temperature between about 700° C. and 900° C. in an oxygen ambient.

11. The method of claim 1 wherein the buffer layer is silicon oxide deposited by a chemical vapor deposition (CVD) or plasma enhanced CVD (PECVD) method.

12. The method of claim 1 wherein the buffer layer is comprised of tetraethylorthosilicate (TEOS).

13. The method of claim 1 wherein said buffer layer is etched back by a plasma generated from $C_2F_6$ with a RF power of about 200 Watts and a chamber pressure of about 4 mtorr at a temperature of about 40° C. for a period of 10 to 30 seconds.

14. The method of claim 1 wherein the cap layer is polysilicon and is removed by a plasma etch comprising a $Cl_2$ flow rate from about 10 to 20 sccm, a HBr flow rate from about 150 to 200 sccm, a chamber pressure between about 4 and 12 Torr, a RF power from about 100 to 450 Watts, and a temperature of about 40° C. to 70° C. for a period between about 50 and 100 seconds.

15. The method of claim 1 wherein said cap layer is silicon nitride and is removed by a wet etch or a plasma etch method.

16. The method of claim 1 wherein the shallow trench is part of a cell array in a flash memory device.

17. A method of forming a shallow trench isolation structure, said method comprising:

providing a substrate having a pad oxide thereon and a polysilicon layer over said pad oxide;

forming a trench in said polysilicon layer and in said pad oxide layer that extends into said substrate;

filling said trench with a dielectric layer;

forming a recessed level of the dielectric layer within said trench;

depositing a conformal oxide buffer layer on said substrate;

etching back said buffer layer to expose said polysilicon layer and said dielectric layer between the sidewalls of said trench; and removing said polysilicon layer with an etch process.

18. The method of claim 17 wherein said pad oxide has a thickness between about 90 and 130 Angstroms and said polysilicon layer has a thickness from about 700 to 2000 Angstroms.

19. The method of claim 17 wherein the depth of said trench is between about 3000 and 4000 Angstroms.

20. The method of claim 17 further comprised of reducing the width of the polysilicon layer and pad oxide layer between said trenches by a plasma etch step comprising a $CF_4$ flow rate from about 80 to 100 sccm, a chamber pressure from about 20 to 40 Torr, a RF power between about 400 and 600 Watts, and a temperature of about 20° C. to 40° C. for a period of about 18 to 30 seconds.

21. The method of claim 17 wherein said dielectric layer is comprised of $SiO_2$ or a low k dielectric material comprised of fluorine doped $SiO_2$ or carbon doped $SiO_2$.

22. The method of claim 17 wherein said recessed dielectric layer formed by a process comprising the steps of:

planarizing the dielectric layer to become coplanar with said polysilicon layer; and etching the coplanar dielectric layer to a height that is below the surface of said substrate.

23. The method of claim 22 wherein etching to recess said dielectric layer is performed with a buffered HF treatment for about 80 to 150 seconds at about 30° C.

24. The method of claim 22 wherein the etching to recess said dielectric layer is performed with a plasma etch method.

25. The method of claim 17 wherein said buffer layer has a thickness between about 100 and 200 Angstroms.

26. The method of claim 17 wherein the buffer layer is comprised of a high temperature oxide that is grown at a temperature between about 700° C. and 900° C. in an oxygen ambient.

27. The method of claim 17 wherein said buffer layer is an oxide that is deposited by a CVD or PECVD technique.

28. The method of claim 17 wherein said buffer layer is tetraethylorthosilicate (TEOS).

29. The method of claim 17 wherein said buffer layer is etched back by a plasma generated from $C_2F_6$ with a RF power of about 200 Watts and a chamber pressure of about 4 mtorr at a temperature of about 40° C. for a period of 10 to 30 seconds.

30. The method of claim 17 wherein said buffer layer is etched back by a plasma that is generated from $CF_4$.

31. The method of claim 17 wherein said polysilicon layer is removed by a plasma etch comprising a $Cl_2$ flow rate from about 10 to 20 sccm, a HBr flow rate from about 150 to 200 sccm, a chamber pressure between about 4 and 12 Torr, a RF power from about 100 to 450 Watts, and a temperature of about 40° C. to 70° C. for a period between about 50 and 100 seconds.

32. The method of claim 17 wherein the shallow trench is part of a cell array in a flash memory device.

* * * * *